(12) United States Patent
Yong et al.

(10) Patent No.: US 6,844,631 B2
(45) Date of Patent: Jan. 18, 2005

(54) SEMICONDUCTOR DEVICE HAVING A BOND PAD AND METHOD THEREFOR

(75) Inventors: Lois E. Yong, Austin, TX (US); Peter R. Harper, Round Rock, TX (US); Tu Anh Tran, Austin, TX (US); Jeffrey W. Metz, Round Rock, TX (US); George R. Leal, Cedar Park, TX (US); Dieu Van Dinh, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 10/097,036

(22) Filed: Mar. 13, 2002

(65) Prior Publication Data

US 2003/0173667 A1 Sep. 18, 2003

(51) Int. Cl.[7] .............................................. H01L 29/40
(52) U.S. Cl. ......................... 257/786; 257/785; 257/48; 257/780
(58) Field of Search ................................ 257/785–786, 257/48, 780

(56) References Cited

U.S. PATENT DOCUMENTS

| | | |
|---|---|---|
| 4,475,191 A | 10/1984 | James |
| 5,506,499 A | 4/1996 | Puar |
| 5,514,892 A | 5/1996 | Countryman et al. |
| 5,554,940 A | 9/1996 | Hubacher |
| 6,144,100 A | 11/2000 | Shen et al. |
| 6,232,662 B1 | 5/2001 | Saran |
| 6,303,459 B1 | 10/2001 | Chen |
| 6,373,143 B1 * | 4/2002 | Bell ........................... 257/786 |
| 6,451,681 B1 * | 9/2002 | Greer ......................... 438/601 |

FOREIGN PATENT DOCUMENTS

| | | |
|---|---|---|
| EP | 1017196 | 7/2000 |
| WO | WO99/36984 | 7/1999 |

OTHER PUBLICATIONS

PCT International Search Report (PCT/US03/11173).
Schiml et al, "A 0.13μm CMOS Platform with Cu/Low–k Interconnects for System On Chip Applications," IEEE, Symposium on VLSI Technology Digest of Technical Papers, 2 pgs (2001).

* cited by examiner

*Primary Examiner*—Luan Thai
(74) *Attorney, Agent, or Firm*—Daniel D. Hill; James L. Clingan, Jr.

(57) ABSTRACT

A bond pad (10) has a probe region (14) and a wire bond region (12) that are substantially non-overlapping. In one embodiment, the bond pad (10) is connected to a final metal layer pad (16) and extends over an interconnect region (24). The bond pad (10) is formed from aluminum and the final metal layer pad (16) is formed from copper. Separating the probe region (14) from the wire bond region (12) prevents the final metal layer pad (16) from being damaged by probe testing, allowing for more reliable wire bonds. In an application requiring very fine pitch between bond pads, the probe regions (14) and active regions (12) of a plurality of bond pads formed in a line may be staggered to increase the distance between the probe regions (14). In addition, forming the bond pads (10) over the interconnect region (24) reduces the size of the integrated circuit.

11 Claims, 8 Drawing Sheets

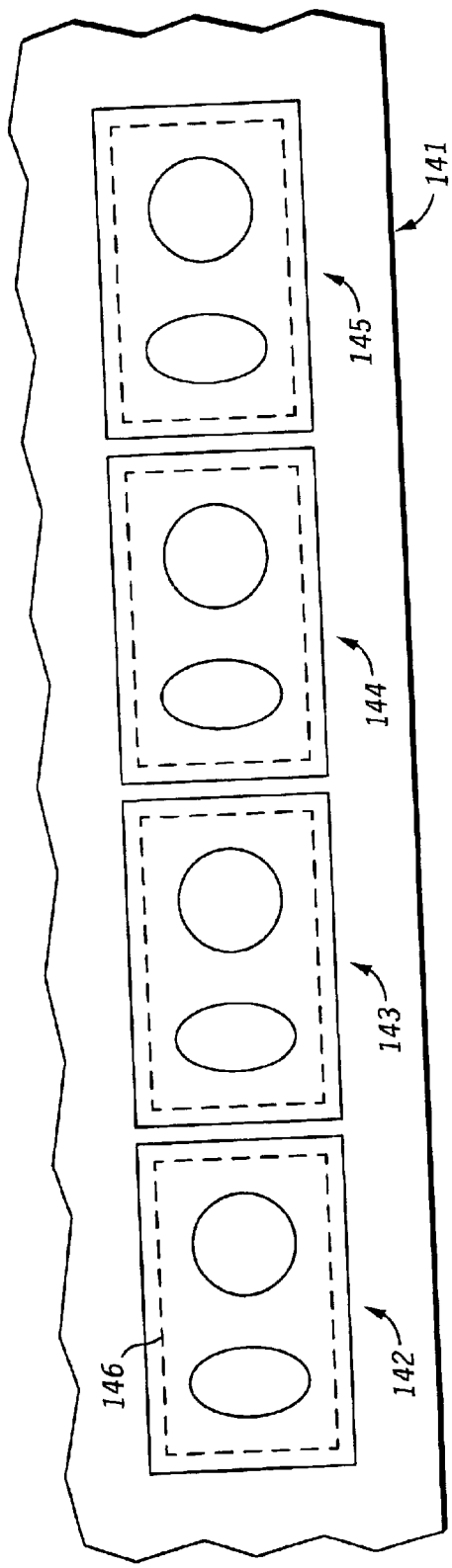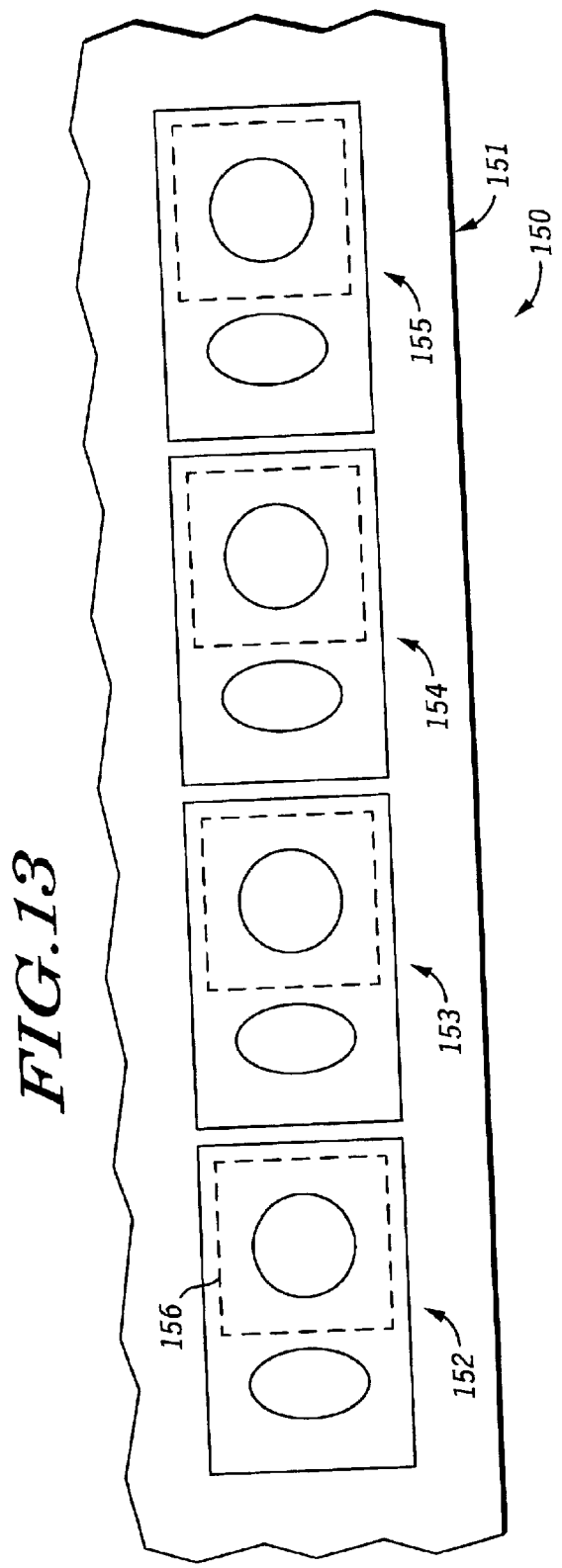

US 6,844,631 B2

SEMICONDUCTOR DEVICE HAVING A BOND PAD AND METHOD THEREFOR

FIELD OF THE INVENTION

The present invention relates generally to semiconductor devices, and more particularly, to a semiconductor device having a bond pad for probe and wire bond isolation and method therefor.

BACKGROUND OF THE INVENTION

In integrated circuit manufacturing, wire bonding is a well proven method used to connect a semiconductor die having electrical circuitry to a pin on a component package. Within integrated circuit manufacturing it is also a common practice to test the functionality of the semiconductor die before completing component assembly. "Probe test" is one such method used to test a semiconductor where a probe contact is commonly used as a mechanical and electrical interface to bond pads on the die.

One problem with using a mechanical interface, for example, a probe needle, is that the bond pads may be damaged or contaminated, preventing a reliable electrical connection between the bond pad and the package pin when the die is wire bonded. This problem is made worse by the decreasing bond pad geometries characteristic of modern deep sub-micron semiconductor technology. Decreasing bond pad geometries include smaller bond pads on which smaller wire bonds are formed. This increases quality and reliability concerns for bond pads that have been damaged by a probe contact. As the bond pad size decreases, the ratio of the damage caused by a probe contact to the bond pad area increases. Another problem with the shrinking bond pad geometries is that the spacing between the bond pads can be too small for robust probe testing using traditional methods such as cantilever probe needles.

Thus, there is a need for the ability to probe test a die without causing unreliable wire bond connections, and to ensure a robust probe test on die with small bond pads and fine pitch spacing of the bond pads. And in many cases, there is a need to meet the preceding criteria without affecting die size significantly to keep costs down.

BRIEF DESCRIPTION OF THE DRAWINGS

FIGS. 5 through 14 illustrate top down views of alternative embodiments of an integrated circuit having a plurality of wire bond pads in accordance with the present invention.

DETAILED DESCRIPTION

Generally, the present invention provides an integrated circuit having a plurality of bond pads. Each of the plurality of bond pads has a probe region and a wire bond region that are substantially non-overlapping and contiguous. In one embodiment, a bond pad extends over active circuitry and/or electrical interconnect layers of the integrated circuit. A portion of, or all, of the bond pad extends over the interconnect layers and a portion of the pad may be formed over a passivation layer and connected to a final metal layer pad. In one embodiment, the bond pad is formed from aluminum and the final metal layer pad is formed from copper.

Separating the probe region from the wire bond region and forming the bond pad over active circuitry has several advantages. In an application requiring very fine pitch between the bond pads, the probe regions and active regions may be staggered to effectively increase the distance between probe regions. By separating the probe region from the wire bond region, the wire bond region is not damaged by probe testing, allowing for more reliable wire bonds. Also, forming the bond pad over active circuitry, including metal interconnect layers, allows the integrated circuit to be smaller.

Figure 1:
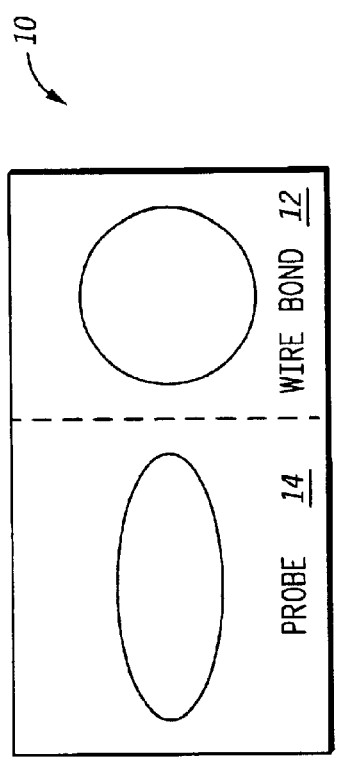
FIG. 1 illustrates a top down view of a wire bond pad in accordance with the present invention.

FIG. 1 illustrates a top down view of a bond pad 10 in accordance with the present invention. Bond pad 10 is separated into a wire bond region 12 and a probe region 14 as indicated by the dashed line. Bond region 12 and probe region 14 are laid out and sized as needed to accommodate the size and accuracy of the wire bonding and probing tools. In the illustrated embodiment, wire bond region 12 is shown smaller than probe region 14. In other embodiments, the regions may be sized differently.

Figure 2:
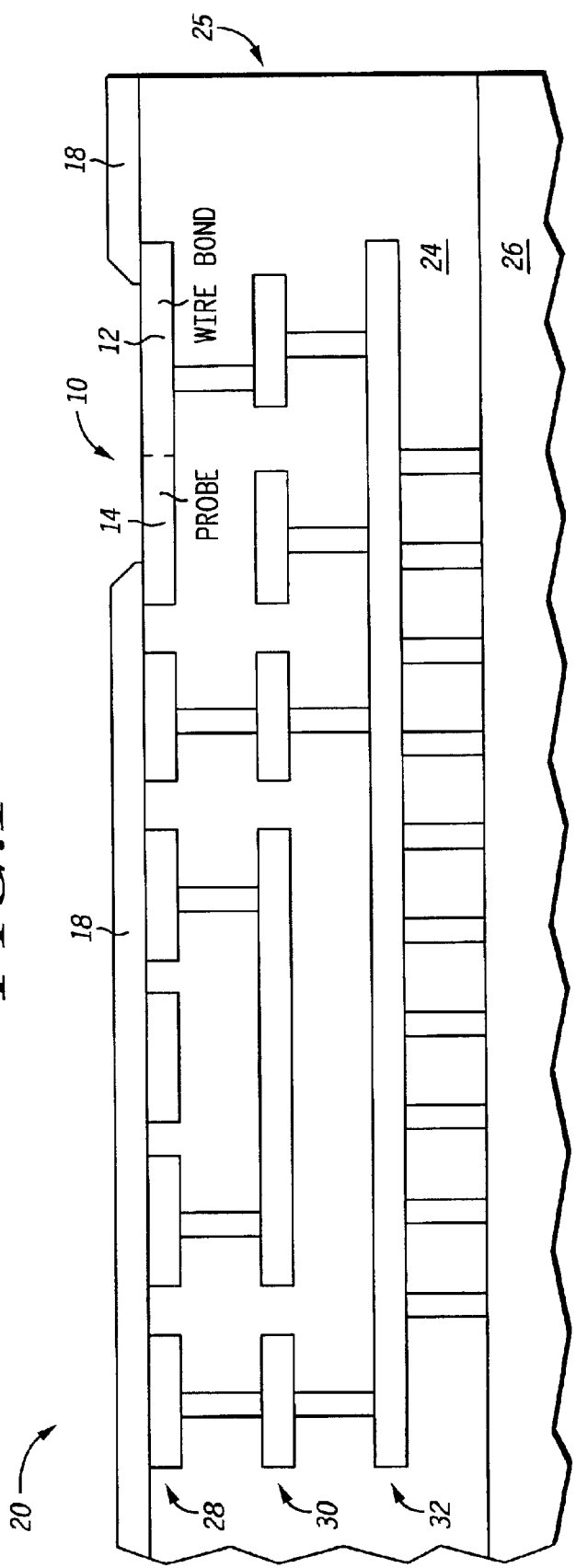
FIG. 2 illustrates a cross-sectional view of a semiconductor device having the wire bond pad of FIG. 1 in accordance with the present invention.

Bond pad 10 can be designed in different semiconductor devices with cross-sectional views illustrated in FIG. 2, FIG. 3, FIG. 4, and FIG. 5. Note that like or similar elements are given the same reference number throughout the figures. Also note the figures are not drawn to scale. FIG. 2 illustrates a cross-sectional view of a semiconductor device 20 in accordance with the present invention. Semiconductor device 20 has an edge, or perimeter 25, passivation layer 18, bond pad 10, interconnect region 24, and active region, or substrate 26. The bond pad 10 has wire bond region 12 and probe region 14 (see FIG. 1) and is positioned relative to perimeter 25. Interconnect region 24 includes metal layers 28, 30, and 32 for routing power, ground, signal, and other lines between various components of semiconductor device 20. As illustrated in FIG. 2, metal layer 28, hereinafter referred to as final metal layer 28 is positioned closed to the surface of semiconductor device 20 also includes bond pad 10 where probe and wire bond are applied for making a connection to a device (not shown) located external to semiconductor device 20. The metal layers of interconnect region 24 may be interconnected between each other using vias. Interconnect metal layer 32 is electrically connected to active region 26 with contacts.

Semiconductor device 20 is subjected to conventional fabrication techniques for forming electrical circuits in active region 26, or substrate. The electrical circuits may be for various integrated circuit applications, such as for example, communications, transportation, general computation, or entertainment. In the illustrated embodiment, metal layers 28, 30, and 32 are formed in conductive materials, for example, aluminum, copper, or gold. In other embodiments, there may be more or less metal layers. Bond pad 10 is formed as part of final metal layer 28. After metal layer 28 is formed, passivation layer 18 is deposited over the surface of the semiconductor device. Openings are provided in passivation layer 18, such as shown over bond pad 10, to allow for electrical contacts, such as between semiconductor device 20 to a pin on a package.

Bond pad 10 is formed from a relatively thick layer of copper. Tests have shown that bond pad 10 is strong enough to withstand the impact of a wire bonding tool and can be formed over interconnect layer 24 without damage to interconnect layer 24 and any underlying circuits of active region 26 as illustrated in FIG. 2.

Figure 3:
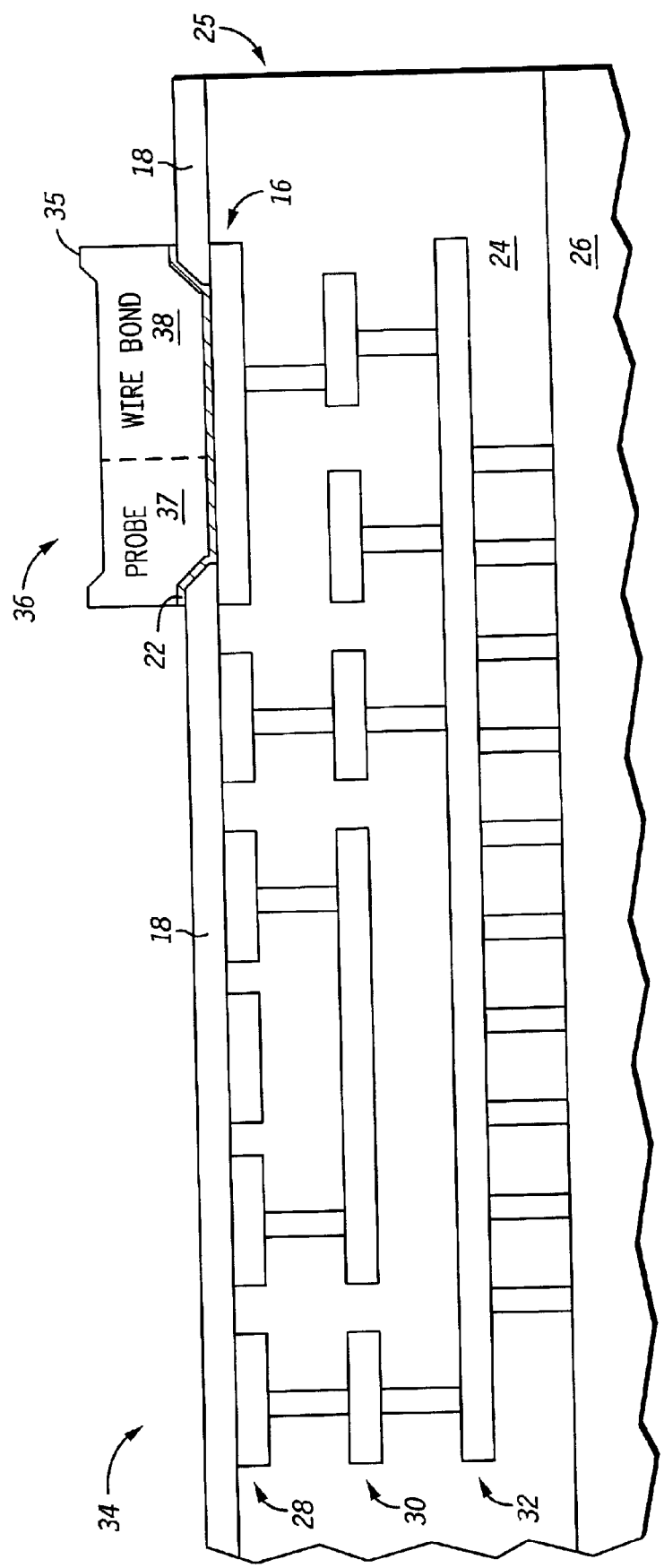
FIG. 3 illustrates a cross-sectional view of a semiconductor device in accordance with another embodiment of the present invention.

FIG. 3 illustrates a cross-sectional view of a semiconductor device 34 in accordance with the present invention. Semiconductor device 34 has an edge, or perimeter 25, passivation layer 18, interconnect region 24, active region 26, and a bond pad 36. Bond pad 36 includes final metal layer pad 16 and aluminum pad layer 35. Aluminum pad layer 35 includes wire bond region 38 and probe region 37. Bond pad 36 is positioned relative to the perimeter 25 of semiconductor device 34 and is separated from the final metal layer pad 16 by a barrier layer 22. Bond pad 36 is laid out and sized to accommodate probe region 37 and wire bond region 38.

Semiconductor device 34 is subjected to fabrication techniques and materials as described for semiconductor device 20 of FIG. 2. In addition, barrier layer 22 is formed over passivation layer 18 to provide a diffusion barrier and adhesion layer between final metal layer pad 16 and bond pad 36, and between bond pad 10 and passivation layer 18. After barrier layer 22 is deposited, aluminum pad layer 35 is deposited over barrier layer 22. Barrier layer 22 and aluminum pad layer 35 are then patterned to form the final shape and size required for probe and wire bond regions. In the illustrated embodiment, aluminum pad layer 35 is formed from aluminum, but in other embodiments, aluminum pad layer 35 may be formed from other electrically conductive materials. Also, metal layers 28, 30, and 32 of the interconnect region 24, and final metal layer pad 16 are formed from copper. In other embodiments, other conductive materials may be used for bond pad 36, final metal layer pad 16, and metal layers 28, 30, and 32. For example, metal layers 28, 30, and 32, and final metal layer pad 16 may be fabricated from aluminum, or gold, and final metal layer pad 16 may include gold. Also, barrier layer 22 is formed from tantalum in the illustrated embodiment. But in other embodiments barrier layer 22 may be any material for forming a diffusion barrier and adhesion layer between dissimilar and adjacent materials. Examples of diffusion and barrier materials are tantalum nitride, titanium, titanium nitride, nickel, tungsten, titanium tungsten alloy, and tantalum silicon nitride.

Aluminum layer pad 35 and final metal pad 16 of bond pad 36 are formed from relatively thick layers of aluminum and copper, respectively. Therefore, bond pad 36 is strong enough to withstand the impact of a wire bonding tool and can be formed over interconnect layer 24 without damage to interconnect layer 24 and any underlying circuits of active region 26 as illustrated in FIG. 3.

Figure 4:
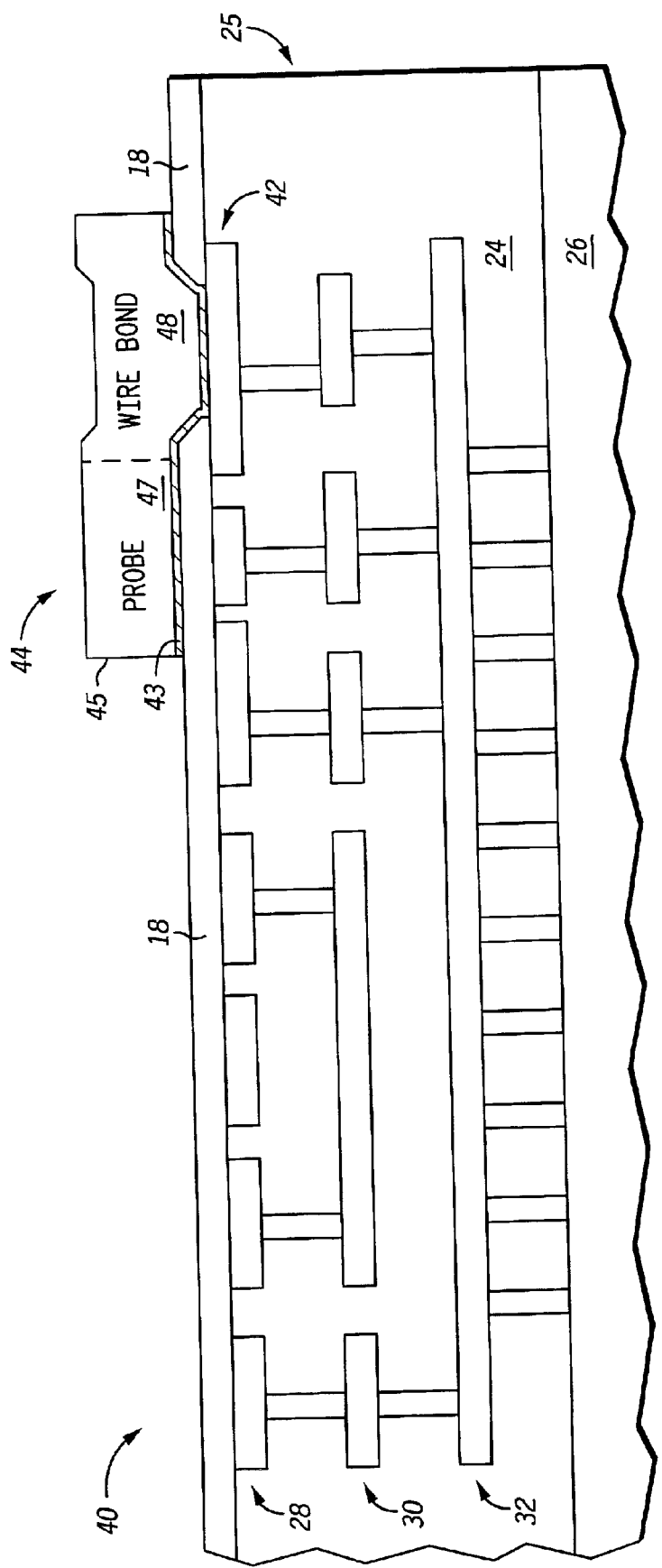
FIG. 4 illustrates a cross-sectional view of a semiconductor device in accordance with another embodiment of the present invention.

FIG. 4 illustrates a cross-sectional view of a semiconductor device 40 in accordance with another embodiment of the present invention. Semiconductor device 40 has an edge, or perimeter 25, passivation layer 18, interconnect region 24, active region 26, and bond pad 44. Bond pad 44 includes aluminum pad 45 and final metal pad 42. Final metal pad 42 is formed as a portion of final metal layer 28. Bond pad 44 is positioned relative to the perimeter 25 of semiconductor device 40 and is separated into a probe region and a wire bond region is illustrated in FIG. 4 by a vertical dashed line. Aluminum pad 45 is separated from the final metal layer pad 42 by a barrier layer 43.

Semiconductor device 40 is subjected to fabrication techniques and materials as described in FIG. 2 and FIG. 3. However, in the device of FIG. 4, one portion of the bond pad 44 extends over passivation layer 18 and underlying active circuitry 26 and/or interconnect region 24, and the remaining portion is connected to the final metal layer pad 42 at an opening in passivation layer 18. As described above, bond pad 44 is separated into a wire bond region and a probe region. The probe region is on the portion of bond pad 10 that extends onto passivation layer 18 and over the electrical interconnect layers 28, 30, and 32 of interconnect region 24. The wire bond region is formed on the portion of bond pad 44 that is connected to the final metal layer pad 42. The wire bond region is strong enough to withstand the impact of a wire bonding tool without damage or deformation to the underlying circuits and may also be formed over the metal layers of interconnect region 24.

By extending the probe region over passivation layer 18, the size of final metal layer pad 42 is not affected, and the size of bond pad 44 can be increased without increasing the overall size of the semiconductor device. Also, because final metal layer pad 42 is not used for probe test or wire bonding, the size and shape of final metal layer pad 42, and the size and shape of opening in passivation layer 18, are only constrained by the area needed to provide an electrical connection to bond pad 44. In other embodiments, there may be a plurality of smaller final metal layer pads and corresponding passivation openings that together provide sufficient electrical connection to bond pad 44. Since bond pad 44 is extended over passivation layer 18 and the size of final metal layer pad 42 is not affected, there is more flexibility in laying out probe and wire bond regions. For an example, the probe region and wire bond region are not necessarily contiguous in other embodiments.

Bond pad 44 may be formed from aluminum and the final metal layer pad 42 may be formed from copper. In addition to separating the probe region from the wire bond region for more reliable wire bonds, probing over the passivation layer 18 eliminates the risk of inadvertently exposing the copper of the final metal layer pad 42. Exposed copper is readily oxidized and creates an unreliable surface for wire bonding.

Figure 5:
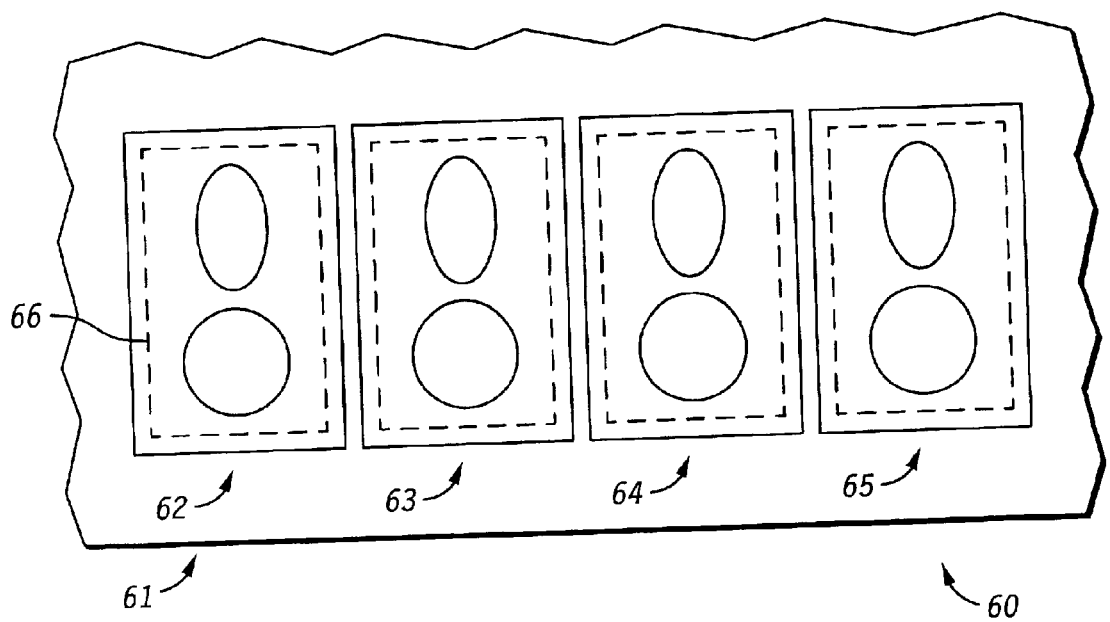

FIG. 5 illustrates a top down view of a semiconductor device 60 in accordance with one embodiment of the present invention. Integrated circuit 60 includes a plurality of bond pads similar to the bond pad illustrated in FIG. 1 and can be constructed in accordance with the embodiments illustrated in FIG. 2 or FIG. 3. Integrated circuit 60 includes a plurality of bond pads 62–65, formed along an edge 61 of the integrated circuit 60. The dashed line on each of the plurality of bond pads indicates an opening 66 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are arranged relative to perimeter 61. The wire bond regions are closer to perimeter 61 than the probe regions of each bond pad. The wire bond regions of adjacent bond pads are maintained in a line an equal distance from edge 61. Likewise, the probe regions of adjacent bond pads are maintained in a line an equal distance from edge 61. In other embodiments, probe regions and wire bond regions may be interchanged.

Figure 6:
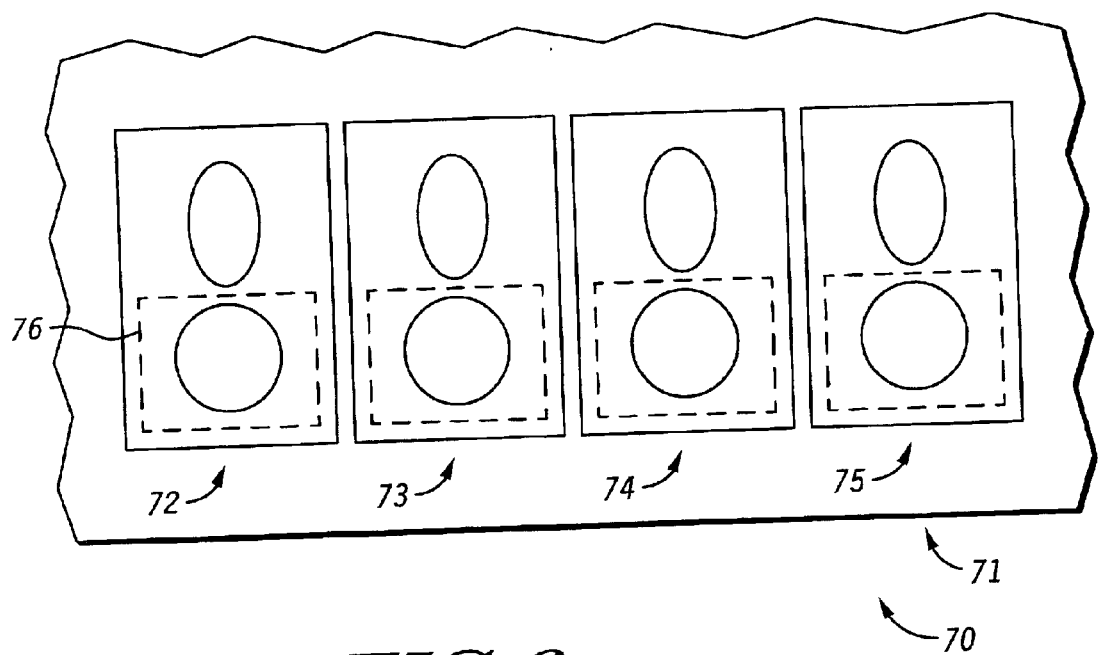

FIG. 6 illustrates a top down view of a semiconductor device 70 in accordance with another embodiment of the present invention. Integrated circuit 70 includes a plurality of bond pads similar to the bond pad illustrated in FIG. 1 and can be constructed in accordance with the embodiments illustrated in FIG. 4. Integrated circuit 70 includes a plurality of bond pads 72–75, formed along an edge 71 of the integrated circuit 70. The dashed line on each of the plurality of bond pads indicates an opening 76 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are arranged relative to perimeter 71. The wire bond regions are closer to perimeter 71 than the probe regions of each bond pad. The wire bond regions of adjacent bond pads are maintained in a line an equal distance from edge 71. Likewise, the probe regions of adjacent bond pads are maintained in a line an equal distance from edge 71. In other embodiments, probe regions and wire bond regions may be interchanged.

A portion of the bond pads 72–75 are formed over the passivation layer, and a portion of the bond pads are formed over the final metal layer pad as illustrated in FIG. 4.

Figure 7:
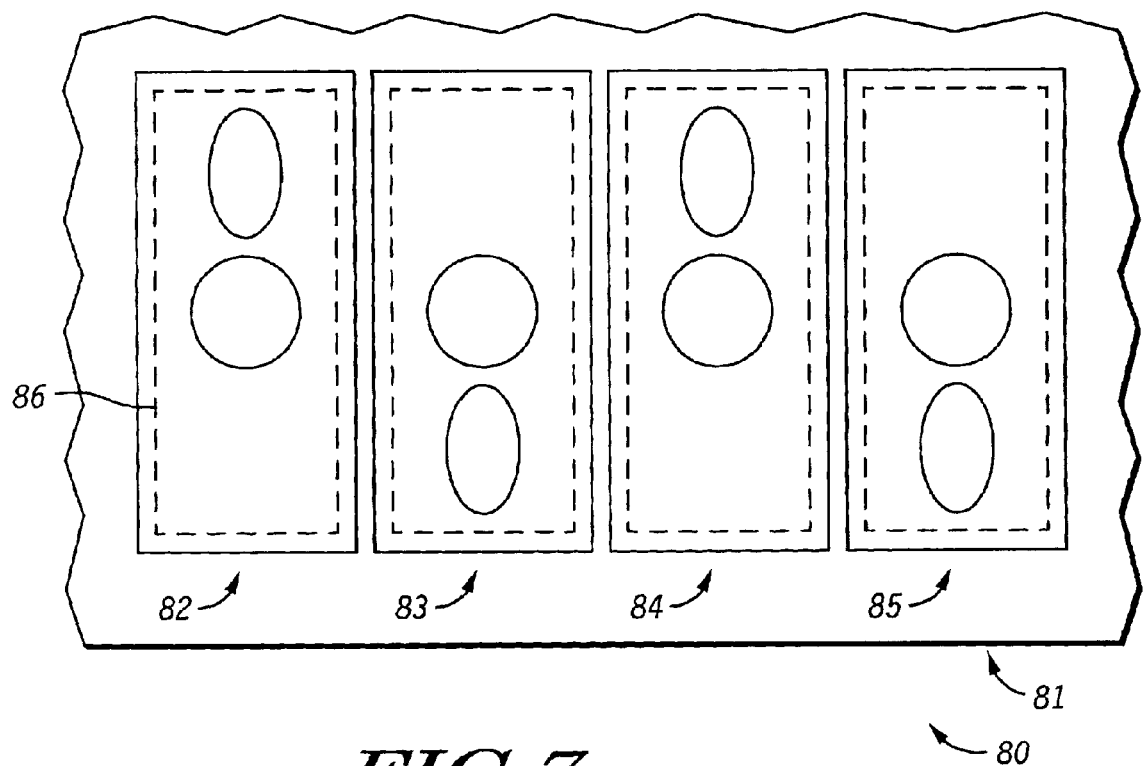

FIG. 7 illustrates a top down view of a semiconductor device 80 in accordance with another embodiment of the present invention. Integrated circuit 80 includes a plurality of bond pads similar to the bond pad illustrated in FIG. 1 and can be constructed in accordance with the embodiments illustrated in FIG. 2 or FIG. 3. Integrated circuit 80 includes a plurality of bond pads 82–85, formed along an edge 81 of the integrated circuit 80. The dashed line on each of the plurality of bond pads indicates an opening 86 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are generally the same size and are arranged generally an equal distance from perimeter 81.

The probe regions (indicated with an oval) are formed in a staggered, alternating manner on opposite sides of the wire bond regions (circles), while the wire bond regions are maintained in a line an equal distance from an edge 81 of integrated circuit 80. Also, the center of each bond pad is maintained in a line an equal distance from edge 81. Substantially all of each of the bond pads 82–85 are formed over the final metal layer pad, as illustrated in FIG. 2 and FIG. 3.

By staggering or alternating the probe regions, the distance between probe regions is increased, allowing for more robust probe testing of very fine pitch devices, and flexibility to use various probe technologies such as for example, cantilever and vertical probe technologies. The current probe technology cannot support a pad pitch below a specified minimum pitch, where pitch refers to a distance between the pads. By elongating the bond pads and staggering the probe regions, current probe technology can be extended to pads having smaller pitch. Maintaining the wire bond regions in a line may make programming of the wire bonding equipment simpler. Note that in other embodiments, the probe regions and the wire bond regions may be interchanged.

Figure 8:
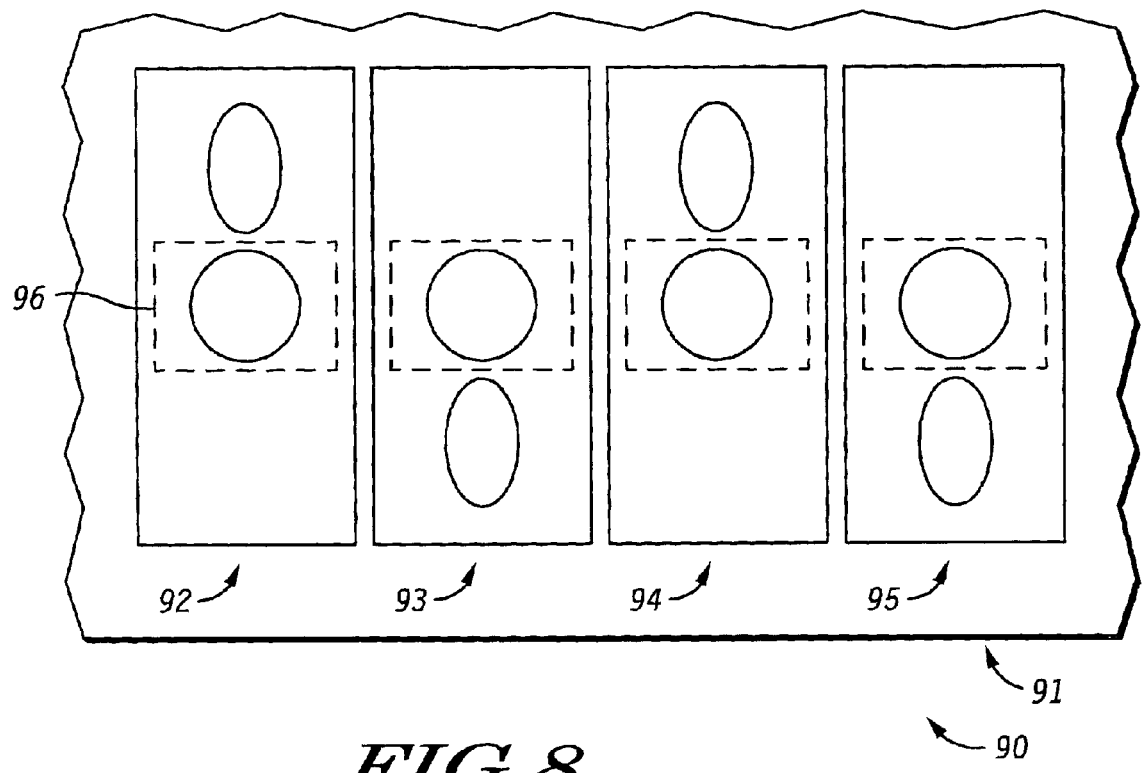

FIG. 8 illustrates a top down view of a semiconductor device 90 in accordance with another embodiment of the present invention. Integrated circuit 90 includes a plurality of bond pads similar to the bond pad illustrated in FIG. 1 and can be constructed in accordance with the embodiments illustrated in FIG. 4. Integrated circuit 90 includes a plurality of bond pads 92–95, formed along an edge 91 of the integrated circuit 90. The dashed line on each of the plurality of bond pads indicates an opening 96 formed in a passivation layer.

The bond pad arrangement of FIG. 8 is the same as the bond pad arrangement of FIG. 7 except that opening 96 in the passivation layer is smaller and only surrounds each of the wire bond regions indicated generally with a circle. The probe regions are indicated with an oval and are staggered as described above for FIG. 7. Also, the probe regions are extended over the passivation layer of semiconductor device 90.

Figure 9:
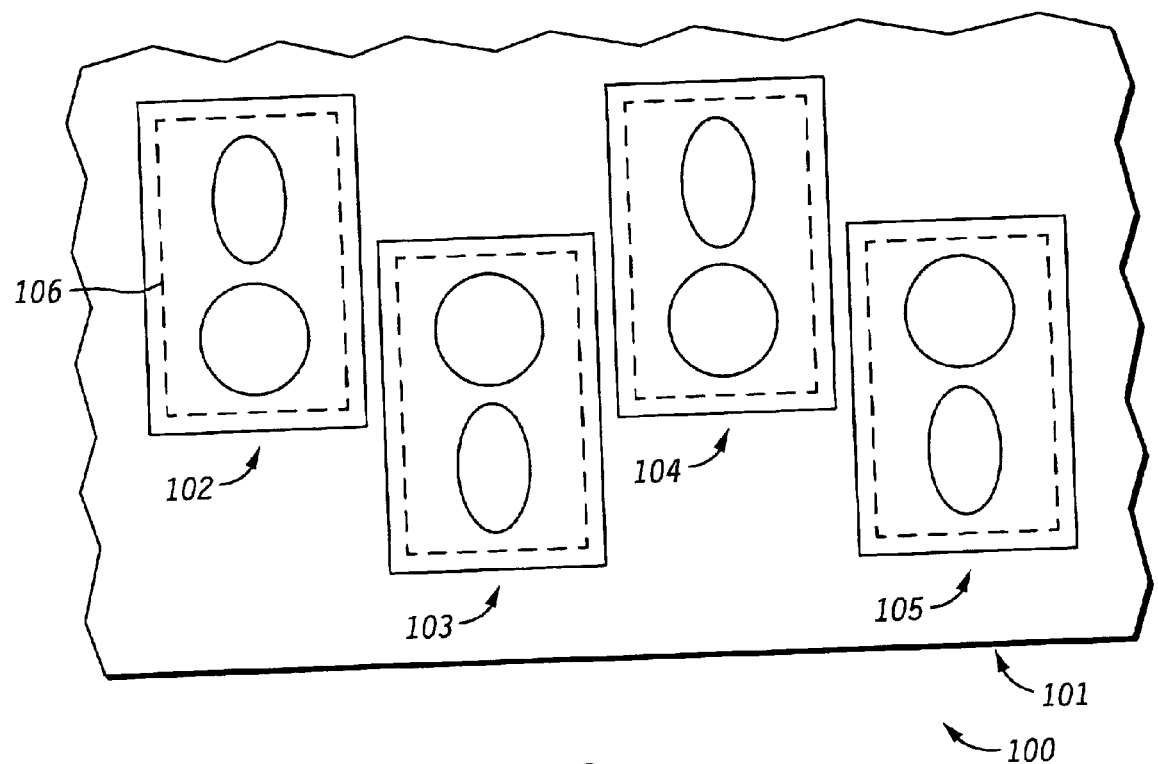

FIG. 9 illustrates a top down view of a semiconductor device 100 in accordance with another embodiment of the present invention. Integrated circuit 100 includes a plurality of bond pads similar to the bond pad illustrated in FIG. 1 and can be constructed in accordance with the embodiments illustrated in FIG. 2 or FIG. 3. Integrated circuit 100 includes a plurality of bond pads 102–105, formed along an edge 101 of the integrated circuit 100. The dashed line on each of the plurality of bond pads indicates an opening 106 formed in a passivation layer.

Opening 96 in the passivation layer surrounds the wire bond region (circle) and the probe region (oval) of each of the bond pads 102–105. The bond pads are arranged in a staggered manner, where bond pads 102 and 104 are located farther away from perimeter 101 than band pads 103 and 105. Also, the probe regions of each of the bond pads are staggered as described above for FIG. 7 and FIG. 8. In addition, the wire bond region of each pad is arranged an equal distance from perimeter 101.

The bond pads of FIG. 9 are shorter than the bond pads of FIG. 8 because the area not used for probe test or wire bonding has been removed. The space provided by the removed portions of the bond pads may provide more surface area on the semiconductor device for more features or bond pads on the integrated circuit.

Figure 10:
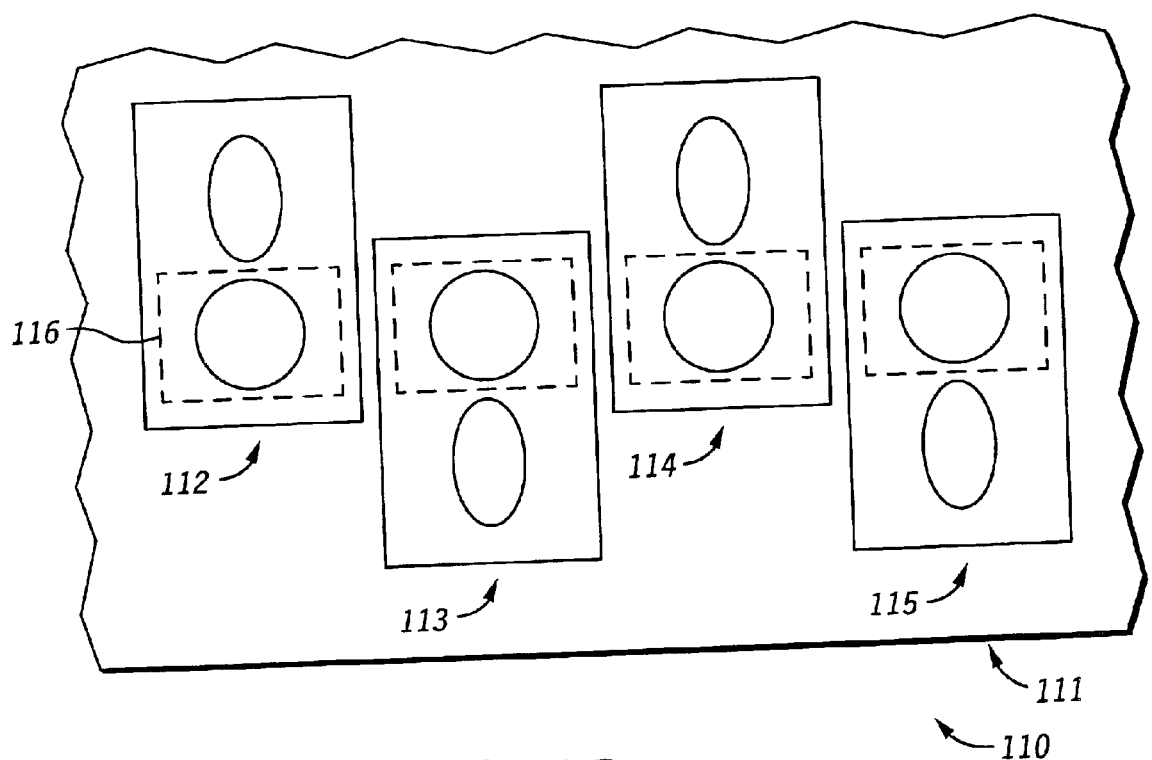

FIG. 10 illustrates a top down view of a semiconductor device 110 in accordance with another embodiment of the present invention. Integrated circuit 110 includes a plurality of bond pads similar to the bond pad illustrated in FIG. 1 and can be constructed in accordance with the embodiments illustrated in FIG. 4. Integrated circuit 110 includes a plurality of bond pads 112–115, formed along an edge 111 of the integrated circuit 110. The dashed line on each of the plurality of bond pads indicates an opening 106 formed in a passivation layer.

Bond pads 112–115 are arranged in a staggered manner, where bond pads 112 and 114 are located farther away from perimeter 111 than band pads 113 and 115. Also, the probe regions of each of the bond pads are staggered as described above for FIG. 7, FIG. 8, and FIG. 9. In addition, the wire bond region of each pad is arranged an equal distance from perimeter 111.

Opening 116 in the passivation layer is smaller and only surrounds each of the wire bond regions indicated generally with a circle. The probe regions are extended over the passivation layer of semiconductor device 110.

Figure 11:
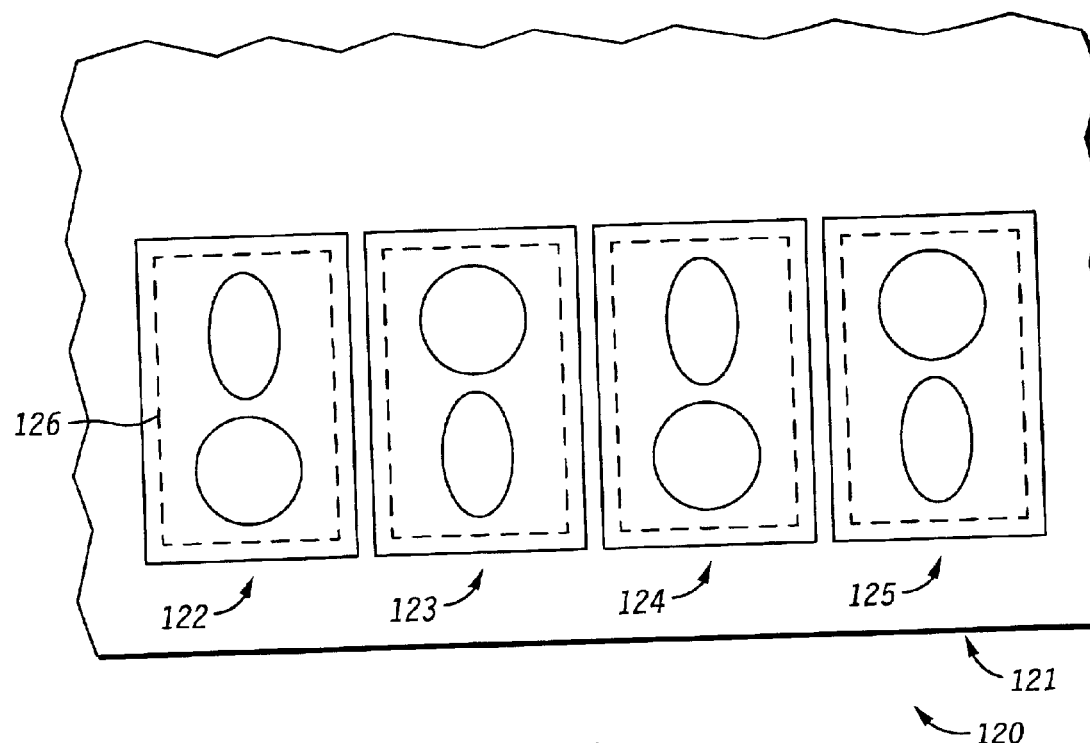

FIG. 11 illustrates a top down view of a semiconductor device 120 in accordance with another embodiment of the present invention. Integrated circuit 120 includes a plurality of bond pads similar to the bond pad illustrated in FIG. 1 and can be constructed in accordance with the embodiments illustrated in FIG. 2 or FIG. 3. Integrated circuit 120 includes a plurality of bond pads 122–125, formed along an edge 121 of the integrated circuit 120. The dashed line on each of the plurality of bond pads indicates an opening 126 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are arranged relative to perimeter 121. In the embodiment of FIG. 11, both the probe regions and the wire bond regions are staggered.

Figure 12:
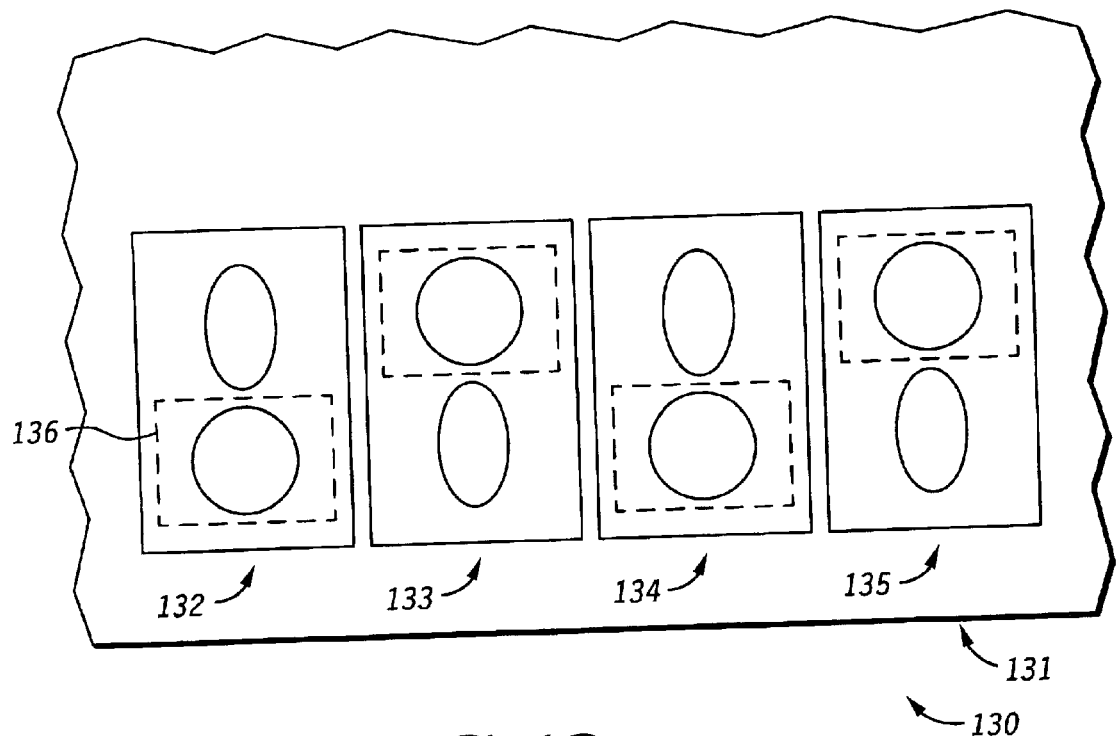

FIG. 12 illustrates a top down view of a semiconductor device 130 in accordance with another embodiment of the present invention. Integrated circuit 130 includes a plurality of bond pads similar to the bond pad illustrated in FIG. 1 and can be constructed in accordance with the embodiments illustrated in FIG. 4. Integrated circuit 130 includes a plurality of bond pads 132"135, formed along an edge 131 of the integrated circuit 130. The dashed line on each of the plurality of bond pads indicates an opening 136 formed in a passivation layer. Each of the bond pads is separated into probe regions and wire bond regions as discussed in FIG. 1. The area on each bond pad bounded by an oval is the area designated generally for probe testing and the area on each bond pad bounded by a circle is the area designated generally for wire bonding. The plurality of bond pads are arranged relative to perimeter 131. In the embodiment of FIG. 12, both the probe regions and the wire bond regions are staggered. Also, the probe regions are formed over the passivation layer.

FIG. 13 illustrates a top down view of a semiconductor device 140 in accordance with another embodiment of the present invention. Integrated circuit 140 includes a plurality of bond pads similar to the bond pad illustrated in FIG. 1 and can be constructed in accordance with the embodiments illustrated in FIG. 2 and FIG. 3. Integrated circuit 140 includes a plurality of bond pads 142–145, formed along an edge 141 of the integrated circuit 140. The dashed line on each of the plurality of bond pads indicates an opening 146 formed in a passivation layer. The area on each bond pad bounded by an oval is the area designated generally for probe testing and the area on each bond pad bounded by a circle is the area designated generally for wire bonding. The long axis of the bond pads are oriented parallel to the edge 141. The wire bond regions and probe regions of adjacent bond pads are maintained in a line an equal distance from edge 141. Because the long axis of the bond pads are oriented parallel to the edge 141 the overall height of the bond pads are reduced while maintaining separate wire bond regions and probe regions for integrated circuits that are not pad limited.

FIG. 14 illustrates a top down view of a semiconductor device 150 in accordance with another embodiment of the present invention. Integrated circuit 150 includes a plurality of bond pads similar to the bond pad illustrated in FIG. 1 and can be constructed in accordance with the embodiments illustrated in FIG. 4. Integrated circuit 150 includes a plurality of bond pads 152–155, formed along an edge 151 of the integrated circuit 150. The dashed line on each of the plurality of bond pads indicates an opening 146 formed in a passivation layer. The area on each bond pad bounded by an oval is the area designated generally for probe testing and the area on each bond pad bounded by a circle is the area designated generally for wire bonding. The long axis of the bond pads are oriented parallel to the edge 151. The wire bond regions and probe regions of adjacent bond pads are maintained in a line an equal distance from edge 151. Because the long axis of the bond pads are oriented parallel to the edge 151 the overall height of the bond pads are reduced while maintaining separate wire bond regions and probe regions for integrated circuits that are not pad limited. In FIG. 14, the probe regions are formed over the passivation layer.

In the foregoing specification, the invention has been described with reference to specific embodiments. However, one of ordinary skill in the art will appreciate that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variations thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. An integrated circuit comprising:
   a substrate having active circuitry and a perimeter;
   a plurality of layers of interconnect over the substrate;
   a final layer of interconnect over the plurality of layers of interconnect having a final layer pad and a plurality of interconnect lines, the final layer pad comprising copper;
   a layer of passivation over the final layer of interconnect having an opening over the final layer pad; and
   a bond pad comprising aluminum formed over and electrically contacting the final layer pad having a first region and a second region, wherein the first region is between the second region and the perimeter, the first and second regions are substantially non-overlapping and contiguous, and the first region performs a function of one of a probe region and a wire bond region and the second region performs the function of one of probe region and wire bond region not performed by the first region, wherein the bond pad is positioned directly over the active circuitry and over interconnect lines of the final layer of interconnect lines that are unrelated to the bond pad.

2. The integrated circuit of claim 1, wherein the opening has a first width and the bond pad extends over the surface of the layer of passivation past the opening in at least one direction by an amount greater than the first width.

3. The integrated circuit structure of claim 1, wherein the opening is filled with tantalum and aluminum.

4. The integrated circuit of claim 1 wherein the bond pad comprises a layer of barrier conductor on the layer of passivation and in the opening and a layer of pad metal over the barrier conductor.

5. The integrated circuit of claim 4, wherein the barrier conductor comprises tantalum and the pad metal layer comprises aluminum.

6. The integrated circuit of claim 4, wherein the barrier conductor is tantalum nitride.

7. The integrated circuit of claim 4, wherein the barrier conductor is selected from one or more of tantalum, titanium nitride, tantalum nitride, and titanium.

8. The integrated circuit of claim 4, wherein the barrier conductor comprises means for providing electrical conduction and adhesion between the final layer pad and the bond pad.

9. The integrated circuit of claim 4, wherein the pad metal is gold.

10. An integrated circuit, comprising:
a substrate having active circuitry and a perimeter;
a first plurality of interconnect layers over the substrate;
a plurality of final layer pads comprising copper over the first plurality of interconnect layers;
a passivation layer having a plurality of openings corresponding to the final layer pads; and
a plurality of bond pads comprising aluminum, coupled to the final layer pads through the openings, having first portions over the openings and second portions over the passivation layer, wherein the second portion is greater in area than the first portion, wherein the plurality of bond pads extend directly over the active circuitry and directly over interconnect lines of a final layer of interconnect lines that are unrelated to the plurality of bond pads, and wherein the second portion is significantly larger than the first portion, and wherein the first portion is for wire bonding and the second portion is for probing.

11. The integrated circuit of claim 10, wherein the plurality of bond pads each have first and second regions, wherein one of the first and second regions is for receiving a probe and the other of the first and second regions is for receiving a wire bond, wherein the first and second regions are substantially non-overlapping.

* * * * *